(12) United States Patent
Satake (10) Patent No.: US 9,237,662 B2
(45) Date of Patent: Jan. 12, 2016

(54) DEVICE HOUSING PACKAGE AND ELECTRONIC APPARATUS EMPLOYING THE SAME

(75) Inventor: Takeo Satake, Higashioumi (JP)

(73) Assignee: KYOCERA Corporation, Kyoto (JP)

( * ) Notice: Subject to any disclaimer, the term of this patent is extended or adjusted under 35 U.S.C. 154(b) by 193 days.

(21) Appl. No.: 13/813,406

(22) PCT Filed: Sep. 21, 2011

(86) PCT No.: PCT/JP2011/071413
§ 371 (c)(1),
(2), (4) Date: Jan. 30, 2013

(87) PCT Pub. No.: WO2012/043313
PCT Pub. Date: Apr. 5, 2012

(65) Prior Publication Data
US 2013/0128489 A1  May 23, 2013

(30) Foreign Application Priority Data
Sep. 28, 2010  (JP) ................................ 2010-217265

(51) Int. Cl.
*H05K 5/00* (2006.01)
*H05K 7/02* (2006.01)
(Continued)

(52) U.S. Cl.
CPC ............ *H05K 5/0091* (2013.01); *H01L 23/057* (2013.01); *H01L 23/10* (2013.01); *H05K 7/02* (2013.01); *H01L 2224/48091* (2013.01)

(58) Field of Classification Search
CPC ......... H01L 24/11; H01L 33/54; H01L 33/62; H01L 2224/48091; H01L 2924/00; H01L 2224/48227; H01L 2924/16195; H01L 23/057; H01L 31/0203; H01R 13/5202; H01R 9/0521; H05K 5/0213; H05K 5/0217; H05K 5/0091; H05K 7/02; H05K 1/181; H05K 1/184; G02B 6/4248; G02B 6/4251; G02B 6/4256; G02B 6/4257; G02B 6/426; B65D 2207/00

USPC ............... 361/820, 301.3, 752; 257/E23.185, 257/E23.001, E23.18, E23.181, E23.183, 257/698, 433; 174/549, 559, 520
See application file for complete search history.

(56) References Cited

U.S. PATENT DOCUMENTS 4,427,991 A * 1/1984 Yamamura et al. ........... 257/664
4,506,108 A * 3/1985 Kersch et al. .................. 174/527
(Continued)

FOREIGN PATENT DOCUMENTS

JP  S64-028845 A  1/1989
JP  H03-254372 A  11/1991
(Continued)

OTHER PUBLICATIONS

International Search Report dated Nov. 8, 2011, issued for International Application No. PCT/JP2011/071413.

*Primary Examiner* — Hung S Bui
*Assistant Examiner* — Michael Matey
(74) *Attorney, Agent, or Firm* — Procopio, Cory, Hargreaves & Savitch LLP (57) ABSTRACT

A device housing package includes a base body (1) including, at its upper surface, a placement portion (1a) of a semiconductor device (9); a frame body (2) disposed on the base body (1) surrounding the placement portion (1a), including a notch (2b) formed by cutting a side wall thereof; an input-output terminal (3) attached to the notch (2b), including a wiring conductor layer (3a) electrically connected to the semiconductor device (9); and a sealing ring (5) disposed on an upper portion of the frame body (2). Moreover, side walls of the frame body (2) have, when seen in a plan view, an outer corner (2c) of adjacent side walls having a curved surface, the outer corner (2c) lying within a region overlapping the sealing ring (5) as seen in a plan view.

3 Claims, 7 Drawing Sheets

(51) Int. Cl.
*H01L 23/057* (2006.01)
*H01L 23/10* (2006.01)

(56) References Cited

U.S. PATENT DOCUMENTS

| | | | |
|---|---|---|---|
| 4,547,624 A * | 10/1985 | Tower et al. | 174/560 |
| 4,873,566 A * | 10/1989 | Hokanson et al. | 257/98 |
| 5,001,299 A * | 3/1991 | Hingorany | 174/521 |
| 5,294,751 A * | 3/1994 | Kamada | 174/541 |
| 5,434,358 A * | 7/1995 | Glahn et al. | 174/551 |
| 5,578,869 A * | 11/1996 | Hoffman et al. | 257/691 |
| 6,365,961 B1 * | 4/2002 | Tomie | 257/664 |
| 6,369,324 B1 * | 4/2002 | Tomie | 174/650 |
| 6,703,703 B2 * | 3/2004 | Grant | 257/688 |
| 6,796,725 B2 * | 9/2004 | Velsher et al. | 385/92 |
| 7,284,913 B2 * | 10/2007 | Powers | 385/92 |
| 2002/0192403 A1 * | 12/2002 | Hanna | 428/34 |
| 2004/0131318 A1 * | 7/2004 | Mori et al. | 385/92 |
| 2004/0183172 A1 * | 9/2004 | Saito et al. | 257/678 |
| 2005/0035447 A1 * | 2/2005 | Basho et al. | 257/712 |
| 2005/0207092 A1 * | 9/2005 | Kubota et al. | 361/301.3 |
| 2009/0229181 A1 * | 9/2009 | Basho et al. | 48/116 |
| 2010/0091477 A1 * | 4/2010 | Takagi et al. | 361/820 |
| 2011/0024313 A1 * | 2/2011 | Nakai | 206/316.1 |
| 2011/0048796 A1 * | 3/2011 | Tsujino | 174/549 |
| 2013/0322036 A1 * | 12/2013 | Tsujino | 361/752 |
| 2014/0008780 A1 * | 1/2014 | Tsujino et al. | 257/690 |

FOREIGN PATENT DOCUMENTS

| | | |
|---|---|---|
| JP | H11-145317 A | 5/1999 |
| JP | 2004-253556 A | 9/2004 |
| JP | 2008-283598 A | 11/2008 |
| WO | 2009130743 A1 | 10/2009 |

* cited by examiner

DEVICE HOUSING PACKAGE AND ELECTRONIC APPARATUS EMPLOYING THE SAME

TECHNICAL FIELD

The present invention relates to a device housing package for use in, for example, a device housing package for containing a semiconductor device, and an electronic apparatus which employs the device housing package.

BACKGROUND ART

Some device housing packages are of a type constructed by bonding a lid body to the upper surface of a frame body through a sealing ring. Such a device housing package is disclosed in, for example, Japanese Unexamined Patent Publication JP-A 11-145317 (1999).

In the above-described device housing package, in joining the lid body to the sealing ring by means of seam welding or the like, a stress tends to be concentrated on a junction between the frame body and the sealing ring due to thermal expansion or thermal shrinkage of the frame body, the sealing ring, and the lid body, wherefore the junction is susceptible to a problem such as cracking and separation.

An object of the invention is to provide a device housing package capable of lessening a stress developed in a junction between a frame body and a sealing ring, as well as to provide an electronic apparatus provided with the device housing package.

DISCLOSURE OF INVENTION

A device housing package in accordance with one embodiment of the invention includes: a base body including, at its upper surface, a placement portion of a semiconductor device; a frame body disposed on the base body surrounding the placement portion, having a notch formed by cutting a side wall thereof; an input-output terminal attached to the notch, including a wiring conductor layer electrically connected to the semiconductor device; and a sealing ring disposed on an upper portion of the frame body. Moreover, side walls of the frame body have, when seen in a plan view, an outer corner of adjacent side walls having a curved surface, the outer corner lying within a region overlapping the sealing ring as seen in a plan view.

An electronic apparatus in accordance with one embodiment of the invention includes: the device housing package; a semiconductor device disposed in the placement portion of the device housing package; and a lid body disposed on the sealing ring of the device housing package.

DESCRIPTION OF EMBODIMENTS

Hereinafter, a device housing package in accordance with one embodiment of the invention and an electronic apparatus which employs the device housing package will be described with reference to drawings.

<Structure of Device Housing Package and Structure of Electronic Apparatus>

Figure 1:
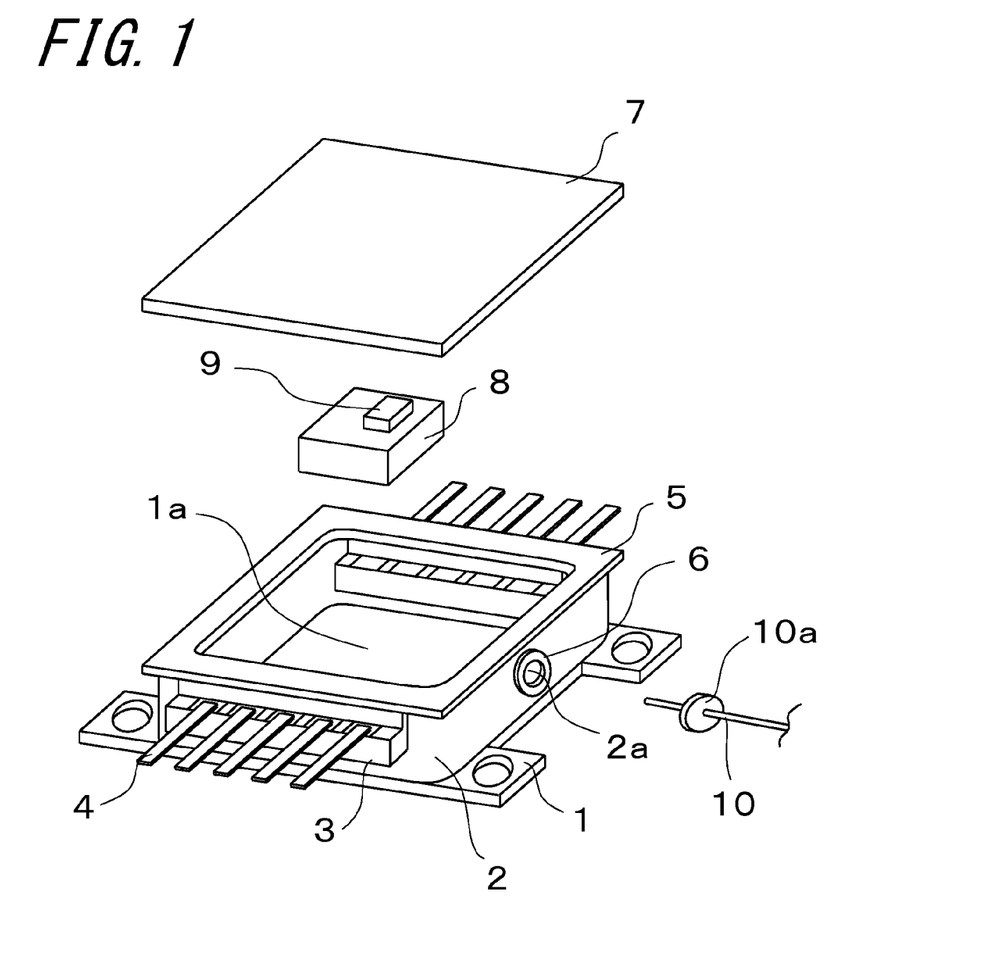
FIG. 1 is an exploded perspective view of an electronic apparatus in accordance with one embodiment of the invention.
Figure 2:
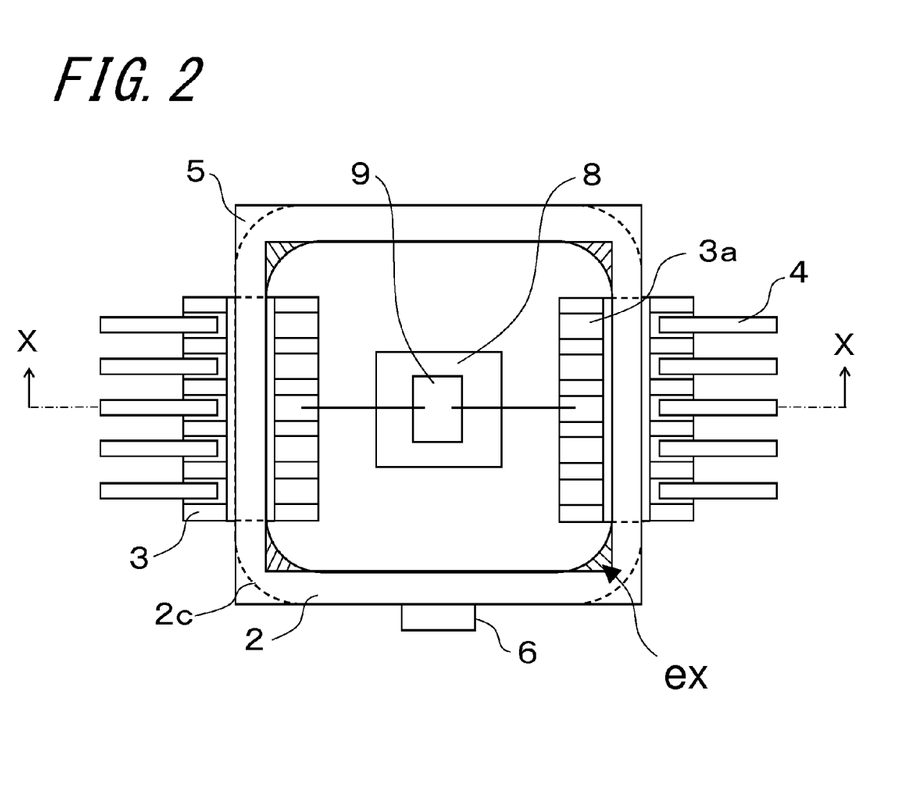
FIG. 2 is a plan view showing the electronic apparatus in accordance with one embodiment of the invention, with its lid body removed.
Figure 3:
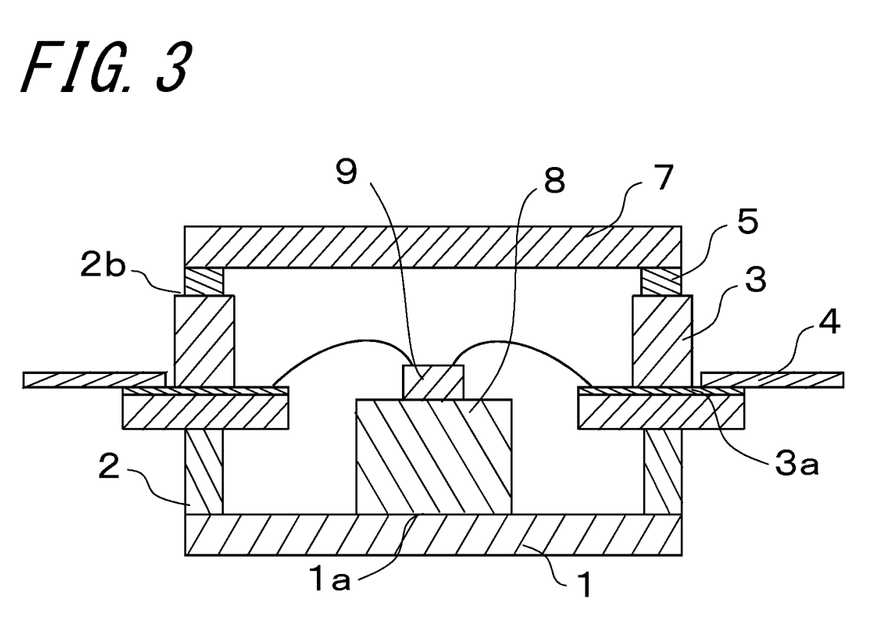
FIG. 3 is a sectional view of the electronic apparatus provided with the lid body taken along the line X-X of FIG. 2.

A device housing package in accordance with one embodiment of the invention includes: a base body 1 having, at its upper surface, a placement portion 1a of a semiconductor device 9; a frame body 2 disposed on the base body 1 surrounding the placement portion 1a, having a notch 2b formed by cutting a side wall thereof; an input-output terminal 3 attached to the notch 2b, having a wiring conductor layer 3a electrically connected to the semiconductor device 9; and a sealing ring 5 disposed on an upper portion of the frame body 2. Moreover, side walls of the frame body 2 have an outer corner 2c of adjacent side walls having a curved surface, the outer corner 2c lying within a region overlapping the sealing ring 5 as seen in a plan view.

An electronic apparatus in accordance with one embodiment of the invention includes: the device housing package; the semiconductor device 9 disposed on the placement portion 1a of the device housing package; and a lid body 7 disposed on the sealing ring 5 of the device housing package.

The base body 1 is a plate-like member. The base body 1 has, at its upper main surface, the placement portion 1a on which the semiconductor device 9 such for example as an optical semiconductor laser or a photodiode is emplaced, with a device placement base 8 interposed between the placement portion 1a and the semiconductor device 9. The base body 1 is made of a metal material such for example as copper, an iron-nickel-cobalt alloy, or a copper-tungsten alloy. For example, the thermal expansion coefficient of the base body 1 is set to fall in the range of 3 (ppm/° C.) or more and 15 (ppm/° C.) or less.

The base body 1 has a screw-mounting portion at each of the four corners thereof. The screw-mounting portion is provided to fasten the device housing package to an external board by means of screwing or the like. Note that the external board is, for example, a heatsink board or a printed circuit board. The semiconductor device 9 may be emplaced directly on the placement portion 1a without the interposition of the device placement base 8.

For example, the base body 1 is produced by shaping an ingot, which is made by casting a metal material in a mold form, into a predetermined form by a heretofore known metalworking technique such as cutting or punching. Note that the thickness of the base body 1 is set to fall in the range of 0.3 (mm) or more and 3 (mm) or less.

The base body 1 has a plating layer on its outer surface. The plating layer is made of a metal which is excellent in corrosion resistance and exhibits good wettability to a brazing material, and is formed by, for example, laminating a nickel plating layer having a thickness of 0.5 (μm) or more and 9 (μm) or less and a gold plating layer having a thickness of 0.5

(μm) or more and 5 (μm) or less one after another by a plating technique. The plating layer is capable of preventing oxidative corrosion of the base body 1 effectively and is also capable of allowing the device placement base 8 to adhere tightly to the upper main surface of the base body 1.

In placing the semiconductor device 9, the device placement base 8 is emplaced on the placement portion 1a, and then the semiconductor device 9 is disposed on the upper surface of the device placement base 8. Moreover, the device placement base 8 functions as a heat transfer medium for transmitting heat from the semiconductor device 9 to the base body 1. With the placement of the device placement base 8 on the base body 1, the vertical positioning of the semiconductor device 9 can be effected readily by making adjustment to the height of the device placement base 8, which leads to improvement in the precision of optical axial alignment between the semiconductor device 9 and an optical fiber 10 and thus to the effect of enhancing optical transmission efficiency.

Moreover, the device placement base 8 is made of a ceramic material such for example as aluminum oxide sintered body, aluminum nitride sintered body, or mullite sintered body. Further, the device placement base 8 is provided with a wiring pattern. The wiring pattern has its one end electrically connected to the semiconductor device 9 through a bonding wire or the like, and has its other end electrically connected to the wiring conductor layer 3a of the input-output terminal 3 through a bonding wire or the like. Note that the thermal expansion coefficient of the device placement base 8 is set to fall in the range of 4 (ppm/° C.) or more and 8 (ppm/° C.) or less.

Moreover, the device placement base 8 may also be constructed by joining an insulating substrate to a mount made of a material such for example as a copper-tungsten alloy or a copper-molybdenum alloy. Further, it is essential only that the device placement base 8 is capable of the secure placement of the semiconductor device 9, and therefore, for example, the device placement base 8 may be constructed by joining an insulating substrate to an electronic cooling device such as a Peltier device.

The frame body 2, which is a frame-like member having a rectangular outer shape, is disposed on the upper main surface of the base body 1 surrounding the placement portion 1a. The frame body 2 has an interior space for containing the semiconductor device 9. Moreover, a side wall of the frame body 2 is provided with a through hole 2a for the installation of an optical fiber. Further, the frame body 2 has, at a side wall thereof, the notch 2b which is formed by cutting an upper part of the side wall.

Moreover, in the frame body 2, when seen in a plan view, the outer corner 2c of the adjacent side walls has a curved surface. That is, the outer corner 2c is an outer corner representing the intersection of the adjacent side walls in the form of a curved surface.

The sealing ring 5, which has a rectangular frame-like outer shape as seen in a plan view, is emplaced on the frame body 2. The sealing ring 5 extends from a region which overlaps the frame body 2 to an outside region which does not overlap the frame body 2. The outer corner 2c of the frame body 2 lies within a region overlapping the sealing ring 5 as seen in a plan view. That is, the sealing ring 5 is disposed on the upper surface of the frame body 2 so that the outer corner 2c of the frame body 2 lies within the range of the sealing ring 5. Note that the four corners, namely the inner or outer corners of the sealing ring 5 are each not limited to a square corner but may have a curved surface.

Moreover, in the sealing ring 5, the four inner corners thereof are located between the outer side surface and the inner side surface of the frame body 2 as seen in a plan view. Thus, a part of the upper surface of the frame body 2 is left exposed. Further, the sealing ring 5 is so disposed that the inner side, except for the four inner corners, coincides with the inner side surface of the frame body 2 as seen in a plan view. Note that the term "coincide" means that the difference between the inner side surface of the sealing ring 5 and the inner side surface of the frame body 2 falls within the range of 0.30 (mm) or less. The diagonally shaded area as seen in FIG. 2 represents an exposed part ex of the frame body 2 lying outside the sealing ring 5.

Moreover, given that the thickness of the side wall of the frame body 2 is 1 (mm) for example, then the radius of curvature of the outer corner 2c of the frame body 2 is set to fall in the range of 0.1 (mm) or more and 3 (mm) or less.

Moreover, the inner corner of the frame body 2 has a curved surface as seen in a plan view. That is, in the frame body 2, the inner corner of the adjacent side walls has a curved surface as seen in a plan view.

Moreover, if the frame body 2 and the sealing ring 5 are so arranged that the four inner corners of the frame body 2 are brought into coincidence with their respective four inner corners of the sealing ring 5, the inner corner of the sealing ring 5 cannot be bonded to the upper surface of the frame body 2, which results in concentration of thermal stress on the corners of the sealing ring 5 and the frame body 2 due to the difference in thermal expansion coefficient between the sealing ring 5 and the frame body 2. In consequence, there arises the possibility of development of a crack or the like from the corner subjected to the concentration of thermal stress. That is, in a case where the radius of curvature of the inner corner of the sealing ring 5 is greater than the radius of curvature of the inner corner of the frame body 2, there arises the possibility of failure of the inner corner of the sealing ring 5 alone to be joined to the frame body 2 with consequent occurrence of cracking. With this in view, in the device housing package of the present embodiment, the radius of curvature of the inner corner of the sealing ring 5 is set to be smaller than the radius of curvature of the inner corner of the frame body 2.

Moreover, in the device housing package of the embodiment, the inner corner of the sealing ring 5 is located between the outer side surface and the inner side surface of the frame body 2 as seen in a plan view. This makes it easy for a brazing material to collect in between the inner corner of the sealing ring 5 and the upper surface of the frame body 2, wherefore the four inner corners of the sealing ring 5 can be connected firmly to their respective four inner corners of the frame body 2. As a result, occurrence of cracking or the like in the corners of the sealing ring 5 and the frame body 2 can be suppressed. Moreover, by arranging the sealing ring 5 and the frame body 2 so that the inner corner of the sealing ring 5 and the inner corner of the frame body 2 are displaced from each other as seen in a plan view, it is possible to achieve dispersion of the stress concentrated on the inner corners of the frame body 2 and the sealing ring 5, and thereby suppress occurrence of cracking or the like in the inner corner of the sealing ring 5 and the inner corner of the frame body 2.

Moreover, the thickness of the side wall of the frame body 2 is set to fall in the range of 0.3 (mm) or more and 1.5 (mm) or less from the viewpoint of enhancing the joinability to the input-output terminal 3 and the heat-dissipation capability while maintaining the rigidity of the frame body 2.

The frame body 2 is made of a metal material such for example as an iron-nickel-cobalt alloy or an iron-nickel alloy. Alternatively, the frame body 2 is made of a ceramic material such for example as aluminum oxide sintered body or aluminum nitride sintered body. The thermal expansion coefficient of the frame body 2 is set to fall in the range of 4 (ppm/° C.) or more and 20 (ppm/° C.) or less. For example, the frame body 2 is produced by shaping an ingot of an iron-nickel-cobalt alloy into a predetermined frame form by a heretofore known press working technique.

The frame body 2 is provided with the through hole 2a which pierces a side wall thereof. The through hole 2a is provided for the installation of an optical fiber which is optically coupled to the semiconductor device 9. Moreover, the frame body 2 has the notch 2b which is formed by cutting the upper part of the side wall thereof adjacent to the side wall provided with the through hole 2a. an optical fiber securing member 6 is disposed in the through hole 2a, and the input-output terminal 3 is attached to the notch 2b.

The input-output terminal 3 is composed of: a flat portion having the wiring conductor layer 3a extending from one side to the other side of the upper surface thereof; and an upstanding wall portion bonded on to the flat portion, with the wiring conductor layer 3a lying between them. Moreover, the flat portion has a projection extending both inwardly and outwardly from the frame body 2.

Moreover, the wiring conductor layer 3a of the input-output terminal 3 located inside the frame body 2 is electrically connected to an electrode disposed on the upper surface of the semiconductor device 9 by a bonding wire or the like, or is electrically connected to the wiring pattern formed in the device placement base 8 on which is emplaced the semiconductor device 9. Moreover, the wiring conductor layer 3a of the input-output terminal 3 located outside the frame body 2 is electrically connected to an external lead terminal 4. The input-output terminal 3 is attached to the notch 2b of the frame body 2 through a brazing material such as silver solder or a silver-copper brazing alloy. Note that the input-output terminal 3 has a metallization layer formed at its junction with the frame body 2, as well as the sealing ring 5. Moreover, in the case where the device placement base 8 is used for an electronic cooling device such as a Peltier device, a lead wire of the electronic cooling device and the wiring conductor layer 3a are electrically connected to each other.

The input-output terminal 3 is made of a ceramic material such for example as aluminum oxide sintered body or aluminum nitride sintered body. Moreover, the wiring conductor layer 3a formed on the flat portion of the input-output terminal 3 is made of tungsten, molybdenum, manganese, or the like.

For example, the wiring conductor layer 3a is formed on the flat portion of the input-output terminal 3 by print-coating a metal paste, which is prepared by admixing organic solvent and solution medium in powder of tungsten, molybdenum, manganese, or the like, on to a ceramic green sheet so as to obtain a predetermined pattern by a heretofore known screen printing technique. Then, the wiring conductor layer 3a is electrically connected to the electrode disposed on the upper surface of the semiconductor device 9 by a bonding wire or the like. Alternatively, the wiring conductor layer 3a is electrically connected to the wiring pattern formed at the device placement base 8 on which is emplaced the semiconductor device 9 by a bonding wire or the like. Thus, an electrical connection with an external electric circuit board is established. Note that, on the wiring conductor layer 3a, there is formed a nickel plating layer or a gold plating layer by a plating technique.

The external lead terminal 4 acts to effect the inputting and outputting of high-frequency signals between an external electric circuit and the input-output terminal 3. That is, the external lead terminal 4 has the function of electrically connecting the semiconductor device 9 to the external electric circuit, and, with the connection of the external lead terminal 4 to the external electric circuit, the semiconductor device 9 can be connected to the external electric circuit through the wiring conductor layer 3a and the external lead terminal 4. The external lead terminal 4 is joined to the wiring conductor layer 3a of the input-output terminal 3 located outside the frame body 2 through a brazing material such as silver solder or a silver-copper brazing alloy.

Moreover, the external lead terminal 4 is made of a metal material such for example as an iron-nickel-cobalt alloy or an iron-nickel alloy. The external lead terminal 4 is produced by shaping an ingot of such a metal into a predetermined form by a heretofore known metalworking technique such as rolling, punching, or etching.

The sealing ring 5 is disposed on the frame body 2 as a joining medium for joining the lid body 7 to the upper surface of the sealing ring 5 by means of seam welding or the like. Moreover, the sealing ring 5 is so placed that at least a part thereof is brought into abutment with the upper surface of the frame body 2. That is, the sealing ring 5 is disposed on the upper surface of the frame body 2, as well as the upper surface of the input-output terminal 3.

Moreover, the sealing ring 5 is bonded to the upper surface of the frame body 2, as well as to the upper surface of the input-output terminal 3 by a brazing material such as silver solder or a silver-copper brazing alloy. Further, the sealing ring 5 is made of a metal material such as an iron-nickel-cobalt alloy or an iron-nickel alloy. In addition, the thermal expansion coefficient of the sealing ring 5 is set to fall in the range of 5 (ppm/° C.) or more and 15 (ppm/° C.) or less, for example.

The optical fiber securing member 6 is disposed at a side wall of the frame body 2, and is a tubular member for securing the optical fiber 10 to the frame body 2. The optical fiber securing member 6 is bonded, through a brazing material such as silver solder or a silver-copper brazing alloy, to a location around an opening of the through hole 2a on the exterior of the frame body 2 or to the inner side of the through hole 2a. The attachment of the optical fiber 10 is made through the optical fiber securing member 6. Moreover, the optical fiber securing member 6 is made of a metal such as an iron-nickel-cobalt alloy or an iron-nickel alloy, and is produced by, for example, shaping an ingot of an iron-nickel-cobalt alloy into a predetermined tubular form by a heretofore known press working technique.

Moreover, in the optical fiber securing member 6, one end of the optical fiber 10 is inserted from outside into the through hole of the optical fiber securing member 6, and the optical fiber 10 is fixed by an adhesive such as solder or by a laser welding technique. In this way, the optical fiber 10 is fixed in optical axial alignment with the semiconductor device 9. This makes it possible to achieve optical coupling between the semiconductor device 9 and the optical fiber 10, and thereby allow communication of optical signals between the internally-mounted semiconductor device 9 and the exterior thereof.

The lid body 7 is rectangular-shaped as viewed from the top, and is, at its outer periphery, bonded to the upper surface of the sealing ring 5 for hermetic sealing of the semiconductor device 9. The lid body 7 and the sealing ring 5 are substantially equal in outer shape, and the lid body 7 is so disposed that it can be exactly superposed on the upper surface of the sealing ring 5. Moreover, the above expression that "the lid body 7 and the sealing ring 5 are substantially equal in outer shape" means that the difference in outer shape between the lid body 7 and the sealing ring 5 falls within the range of 0.5 (mm) or less.

Moreover, the lid body 7 is made of a metal material such as an iron-nickel-cobalt alloy or an iron-nickel alloy. The lid body 7 is joined to the sealing ring 5 bonded to the upper surface of the frame body 2 by means of seam welding. Further, the thermal expansion coefficient of the lid body 7 is set to fall in the range of 5 (ppm/° C.) or more and 20 (ppm/° C.) or less, for example.

Moreover, from the viewpoint of enhancing the joining strength, the lid body 7 may be made one size larger than the sealing ring 7 so that, when lid body 7 is seen in a plan view, the outer periphery of the lid body 7 is located outside of the outer periphery of the sealing ring 5. It is advisable that the outer periphery of the lid body 7 is spaced outward from the outer periphery of the sealing ring 5 by a distance of 0.1 (mm) or more and 1.0 (mm) or less, for example.

Moreover, the lid body 7 allows the semiconductor device 9 to be hermetically sealed in an interior area defined by the base body 1, the frame body 2, the input-output terminal 3, and the sealing ring 5. Note that, for example, the lid body 7 is produced by shaping an ingot of an iron-nickel-cobalt alloy, an iron-nickel alloy, or the like into a predetermined form by a heretofore known press working technique.

The semiconductor device 9 is fixedly bonded to the placement portion 1a of the upper main surface of the base body 1, with the device placement base 8 interposed between them. Then, the electrode disposed on the upper surface of the semiconductor device 9 is connected to the wiring conductor layer 3a through a bonding wire or the like. Alternatively, the wiring conductor layer is electrically connected to the wiring pattern formed at the device placement base 8 by solder, a bonding wire, or the like. Next, the lid body 7 is joined to the upper surface of the frame body 2 through the sealing ring 5 by a welding technique such as seam welding, so that the semiconductor device 9 is hermetically contained in the interior area defined by the base body 1, the frame body 2, the input-output terminal 3, the sealing ring 5, and the lid body 7, thereby constituting an electronic apparatus. That is, the electronic apparatus can be implemented by mounting at least the semiconductor device 9, and whereafter placing the lid body 7 for sealing.

Moreover, one end of the optical fiber 10 is inserted, through an optical fiber support member 10a, into the optical fiber securing member 6 of the frame body 2 for securement. Then, the optical fiber 10 is secured to the optical fiber securing member 6 by an adhesive such as solder or by a laser welding technique. In this electronic apparatus, the optical fiber 10 may also be disposed after the mounting of the electronic apparatus on an external electric circuit board or the like. In another alternative, the electronic apparatus in itself may be equipped with the optical fiber 10 as a finished product. Thus, communication of optical signals can be effected between the internally-mounted semiconductor device 9 and the exterior thereof by way of the optical fiber 10.

In the joining together of the sealing ring 5 and the lid body 7, the lid body 7 is, at its outer periphery, joined to the upper surface of the sealing ring 5 by means of seam welding or the like. In this way, since the sealing ring 5, the lid body 7, and the frame body 2 are subjected to high-temperature heat of, for example, 900 (° C.) or higher and 1800 (° C.) or lower during the joining together of the sealing ring 5 and the lid body 7, it follows that, when the sealing ring 5 and the lid body 7 are joined together by seam welding, a thermal stress is developed in the sealing ring 5, the lid body 7, and the frame body 2 due to thermal expansion or thermal shrinkage.

Accordingly, when the lid body 7 is joined to the sealing ring 5 by means of seam welding or the like, due to the heat liberated by the seam welding, it is likely that a stress is caused by thermal expansion or thermal shrinkage resulting from the difference in thermal expansion coefficient among the frame body 2, the sealing ring 5, and the lid body 7. In consequence, there arises the possibility that a stress is concentrated on, of the junction between the frame body 2 and the sealing ring 5, a part around the outer corner 2c of the frame body 2, which leads to occurrence of cracking, separation or the like in the junction between the outer corner 2c of the frame body 2 and the sealing ring 5.

According to the device housing package of the embodiment, in the frame body 2, the outer corner 2c of the adjacent side walls has a curved surface, and, when seen in a plan view, the sealing ring 5 is disposed in abutment with the upper surface of the frame body 2, with the outer corner 2c lying within the range of the sealing ring 5. In this way, the stress caused by thermal expansion or thermal shrinkage resulting from the difference in thermal expansion coefficient among the frame body 2, the sealing ring 5, and the lid body 7 is absorbed and lessened by dispersing the stress along the curved surface of the outer corner 2c of the frame body at a part of the junction between the frame body 2 and the sealing ring 5 around the outer corner 2c of the frame body 2. Also, the stress is absorbed and lessened by the deformation of the sealing ring 5 extending outward beyond the outer corner 2c of the frame body 2. This makes it possible to suppress localized concentration of a stress on the junction between the frame body 2 and the sealing ring 5, and thereby suppress occurrence of cracking, separation, or the like caused by the stress in the junction between the outer corner 2c of the frame body 2 and the sealing ring 5.

According to the device housing package of the embodiment, the sealing ring 5 has a rectangular frame-like outer shape as seen in a plan view, and, a part of the upper portion of the frame body 2 is exposed to provide the exposed part ex lying in a region surrounded by the sealing ring 5 as seen in a plan view. In the exposed upper part of the frame body 2, a brazing material used for the brazing connection between the upper surface of the frame body 2 and the lower surface of the sealing ring 5 can be easily collected. As a result, the strength of joining between the frame body 2 and the sealing ring 5 can be increased, wherefore a device housing package and an electronic apparatus having excellent sealing capability can be put into practice.

Moreover, by configuring the frame body 2 so that a part of its upper surface surrounded by the sealing ring 5 is left exposed, it is possible to make the brazing material for establishing connection between the frame body 2 and the sealing ring 5 less prone to flow out of the upper portion of the frame body 2, and thereby decrease the possibility of the flow of the brazing material for the connection between the frame body 2 and the sealing ring 5 into the inner wall surface of the frame body 2. Accordingly, it is possible to suppress that the brazing material which flowed into the inner wall surface of the frame body 2 causes electrical shorting of a plurality of wiring conductor layers 3a of the input-output terminal 3, wherefore a device housing package and an electronic apparatus that suffer little from electrical failure and are capable of improvement in manufacturing yield can be put into practice.

Moreover, according to the device housing package of the embodiment, the side walls of the frame body 2 have, when seen in a plan view, the inner corner of the adjacent side walls having a curved surface. Besides that, in the course of assembly of the device housing package or driving operation of the electronic apparatus, a thermal stress is applied to the frame body 2 under the influence of temperature change within the package. Although the location of connection between the adjacent side walls of the frame body 2 is particularly susceptible to thermal stress concentration, the frame body 2 has, when seen in a plan view, the inner corner of the adjacent side walls having a curved surface, and therefore it is possible to lessen the concentrated stress and thereby suppress breakage of the frame body 2. As a result, it is possible to suppress separation of the frame body 2 from the base body 1, wherefore a device housing package and an electronic apparatus having excellent sealing capability can be put into practice.

Moreover, according to the device housing package of the embodiment, the exposed upper part ex of the frame body 2 is situated in an intervening location between the outer corner of the frame body 2 and the inner corner of the frame body 2 as seen in a plan view. The frame body 2 has the inner corner of the adjacent side walls having a curved surface as seen in a plan view and, when seen in a plan view, of the region surrounded by the sealing ring 5, the intervened location between the outer corner of the frame body 2 and the inner corner of the frame body 2 is left exposed, and therefore the brazing material for the joining of the sealing ring 5 can be collected in the exposed upper surface of the frame body 2. Then, a meniscus of the brazing material is formed in between the upper surface of the frame body 2 and the inner corner of the sealing ring 5. As a result, the sealing ring 5 is, at its inner corner, joined to the frame body 2 with greater joining strength, wherefore cracking or separation of the frame body 2 and the sealing ring 5 is suppressed, which cracking or separation is ascribable to the thermal expansion or thermal shrinkage of the frame body 2 and the sealing ring 5.

Moreover, by virtue of the structure in which the four corners of the frame body 2 are not brought into coincidence with their respective four corners of the sealing ring 5, it is possible to suppress that the stress caused by the thermal expansion or thermal shrinkage of the frame body 2 and the sealing ring 5 is concentrated on the four corners of the frame body 2 joined to the base body 1. Since the stress is further dispersed to the meniscus formed in between the upper surface of the frame body 2 and the corner of the sealing ring 5, cracking or separation of the frame body 2 and the sealing ring 5 is suppressed.

Moreover, according to the device housing package of the embodiment, of the side walls of the frame body 2, the one adjacent to the side wall having the notch 2b is formed in a manner such that the outer shape of the frame body 2 coincides with the outer shape of the sealing ring 5 as seen in a plan view. By forming, of the side walls of the frame body 2, the side wall free of the input-output terminal 3 in a manner such that the frame body 2 coincides in outer shape with the sealing ring 5, when the sealing ring 5 is joined to the frame body 2 by a brazing material, it is possible to apply the brazing material only to the joining surfaces of the frame body 2 and the sealing ring 5. If, of the side walls of the frame body 2, the one adjacent to the side wall having the notch 2b is formed in a manner such that the outer shape of the frame body 2 does not coincide with the outer shape of the sealing ring 5, inconveniently the brazing material wettingly spreads over an unexpected, superfluous part of the sealing ring. By contrast, in the device housing package of the embodiment, since, of the side walls of the frame body 2, the one adjacent to the side wall having the notch 2b is such that the frame body 2 coincides in outer shape with the sealing ring 5, it follows that a decline in joining strength ascribable to lack of uniformity in the wet spread of the brazing material is suppressed, wherefore a package having excellent sealing capability can be put into practice.

In the electronic apparatus of the present embodiment, with use of the device housing package as above described, it is possible to suppress that the stress caused by the heat generated in the joining of the lid body 7 to the sealing ring 5 by means of seam welding or the like is concentrated on a specific part of the frame body 2 as well as the sealing ring 5 that eventually leads to occurrence of cracking, separation or the like in the junction between the frame body 2 and the sealing ring 5.

<Method of Manufacturing Device Housing Package and Electronic Apparatus>

Now, a method of manufacturing the device housing package and the electronic apparatus which employs the device housing package will be described. For example, the base body 1 is produced by shaping an ingot made by casting an iron-nickel-cobalt alloy in a mold form into a predetermined form by a heretofore known metalworking technique such as cutting or punching. Moreover, for example, the frame body 2 is produced by forming the outer corner 2c, the through hole 2a, and the notch 2b in an ingot made by casting an iron-nickel-cobalt alloy in a mold form by a heretofore known metalworking technique such as cutting or punching.

Moreover, for example, the lid body 7 is produced by shaping an ingot made by casting an iron-nickel-cobalt alloy in a mold form into a predetermined form by a heretofore known metalworking technique such as cutting or punching.

Moreover, the input-output terminal 3 is composed of the flat portion and the upstanding wall portion bonded to the upper surface of the flat portion. In the case where the input-output terminal 3 is made of aluminum oxide sintered body for example, green sheets for the flat portion and the upstanding wall portion are formed by admixing an organic binder, a plasticizer, a solvent, a dispersant, and so forth in powder of a raw material such as aluminum oxide, silicon oxide, magnesium oxide, or calcium oxide thereby to prepare a paste and subjecting the paste to the doctor blade method or calender roll method, for example. Then, the flat-shaped green sheets are subjected to punching using a die in accordance with the configurations of the flat portion and the upstanding wall portion.

In the flat portion, a metal paste layer which acts as the wiring conductor layer 3a is formed by print-coating an electrically conducting paste, which is prepared by adding an organic binder, a plasticizer, a solvent, and so forth in powder of a high-melting-point metal such as tungsten, molybdenum, or manganese, to a predetermined location on the upper surface of the flat portion by means of screen printing or the like. Moreover, in the flat portion, as well as the upstanding wall portion, a metallization layer is formed in a location corresponding to its junction with the frame body 2 as well as the sealing ring 5 by print-coating of a metal paste.

Further, the upstanding wall portion in green-sheet form is laid on the flat portion in green-sheet form, and they are fired simultaneously at a temperature of about 1600° C., so that the flat portion and the upstanding wall portion are integrally formed after the firing process thereby to constitute the input-output terminal 3.

In addition, a nickel plating layer having a plating-layer thickness of 1.0 (μm) or more and 3.0 (μm) or less is formed on the wiring conductor layer 3a and on the metallization layer by a plating technique such as the electrolytic plating method or electroless plating method.

For example, the external lead terminal 4 is produced by shaping an ingot made by casting an iron-nickel-cobalt alloy in a mold form into a predetermined form by a heretofore known metalworking technique such as cutting or punching. The external lead terminal 4 is bonded, through a brazing material such as silver solder or a silver-copper brazing alloy, to the wiring conductor layer 3a of the input-output terminal 3 located outside the frame body 2.

For example, the sealing ring 5 is produced by shaping an ingot made by casting an iron-nickel-cobalt alloy in a mold form into a predetermined form by a heretofore known metalworking technique such as cutting or punching.

The device housing package is constructed by joining the base body 1, the frame body 2, the input-output terminal 3, and the sealing ring 5 together through a brazing material such as silver solder or a silver-copper brazing alloy.

Moreover, in the wiring conductor layer 3a and the metallization layer exposed outside the device housing package, on the already-formed nickel plating layer, there are further formed a nickel plating layer having a plating-layer thickness of 0.5 (μm) or more and 3.0 (μm) or less and a gold plating layer having a plating-layer thickness of 0.5 (μm) or more and 3.0 (μm) or less by a plating technique such as the electrolytic plating method or electroless plating method.

Now, a method of manufacturing the electronic apparatus will be described. In constructing the electronic apparatus, the device placement base 8 is fixedly bonded to the placement portion 1a of the base body 1 of the device housing package by using a material such for example as gold-tin solder or gold-germanium solder. Then, the semiconductor device 9 is fixedly bonded on to the device placement base 8 through gold-tin solder or the like. In the case where the device placement base 8 is formed with a wiring pattern, the semiconductor device 9 is electrically connected to one end of the wiring pattern formed at the device placement base 8 by a bonding wire or the like. Moreover, the other end of the wiring pattern is electrically connected to the wiring conductor layer 3a of the input-output terminal 3 by a bonding wire or the like. Next, the lid body 7 is joined to the upper surface of the sealing ring 5 by a welding technique such as seam welding, so that the semiconductor device 9 is hermetically contained in the interior area formed by the base body 1, the frame body 2, the input-output terminal 3, the sealing ring 5, and the lid body 7, thereby constituting the electronic apparatus.

It should be understood that the application of the invention is not limited to the embodiment as described heretofore, and that many modifications and variations of the invention are possible without departing from the spirit and scope of the invention. Hereinafter, modified examples of the embodiment will be described. Note that the constituent components of the device housing package according to the modified example of the embodiment that are similar to those of the device housing package of the embodiment will be identified with the same reference symbols, and the descriptions thereof will be appropriately omitted.

<Modified Example 1>

Figure 4:
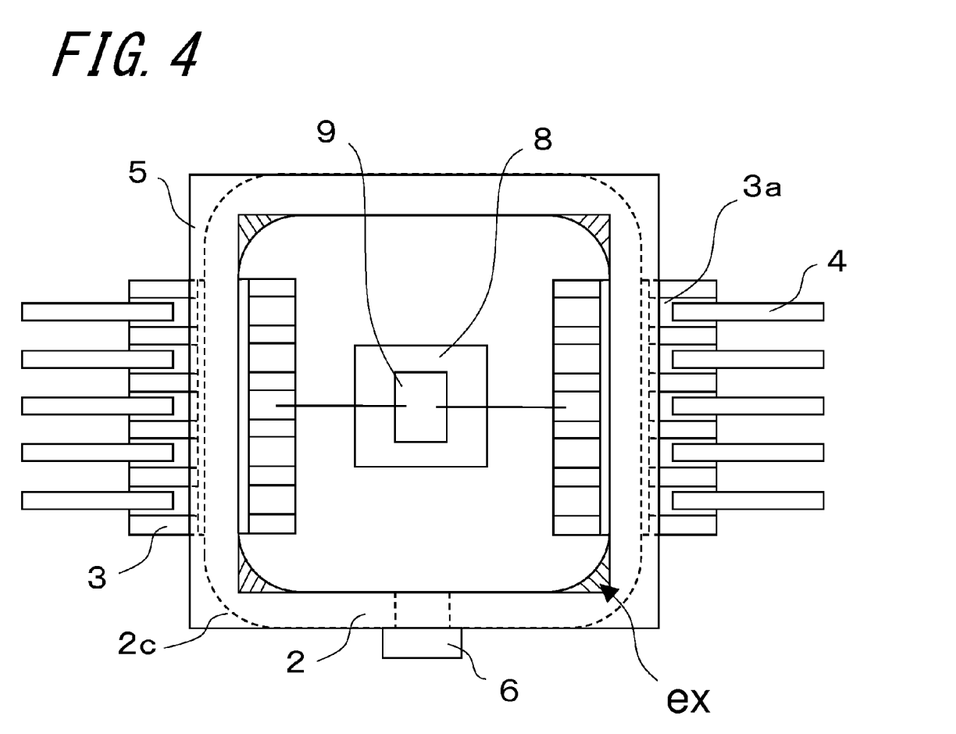
FIG. 4 is a plan view showing the electronic apparatus in accordance with one modified example of the invention, with its lid body removed.
Figure 5:
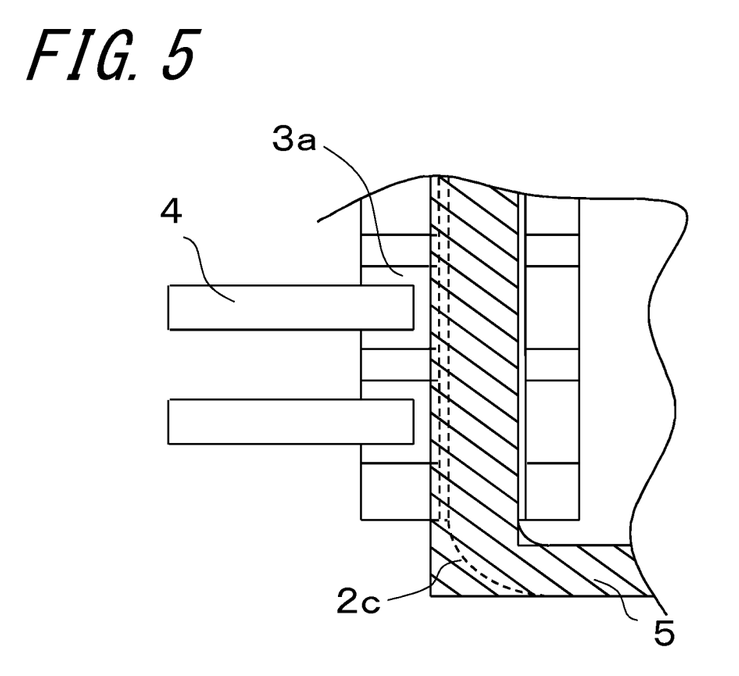
FIG. 5 is an enlarged view of a main part of the electronic apparatus as shown in FIG. 4, illustrating a positional relationship between a sealing ring and a frame body.

In the device housing package of Modified example 1 of the embodiment, as shown in FIG. 4, the sealing ring 5 may be made larger in outer shape than the frame body 2 as seen in a plan view so as to extend outward beyond the upper surface of the input-output terminal 3 attached to the notch 2b of the frame body 2. The diagonally shaded area as seen in FIG. 4 represents the exposed part ex of the frame body 2 lying outside the sealing ring 5. Moreover, FIG. 5 is an enlarged view of a main part of the construction, illustrating the condition where the sealing ring 5, which is diagonally shaded, extends outward beyond the upper surface of the input-output terminal 3. Note that the upper surface of the input-output terminal 3 refers to the upper surface of the upstanding wall portion constituting the input-output terminal 3.

In the case of joining the lid body 5 to the sealing ring 5 by means of seam welding or the like, the heat liberated by the seam welding or the like is not directly applied to an upper part of the junction between the input-output terminal 3 and the sealing ring 5 but applied to the sealing ring 5 extending outward beyond the upper surface of the input-output terminal 3 and the outer periphery of the lid body 7. This helps reduce the heat applied to the junction between the input-output terminal 3 made of a ceramic material and the sealing ring 5 made of metal. As a result, the stress caused by thermal expansion or thermal shrinkage resulting from the difference in thermal expansion coefficient between the input-output terminal 3 and the sealing ring 5, expressed differently, the stress exerted on the junction between the input-output terminal 3 and the sealing ring 5, can be lessened. This makes it possible to suppress cracking, separation or the like caused by the stress in the junction between the input-output terminal 3 and the sealing ring 5.

<Modified Example 2>

Figure 6:
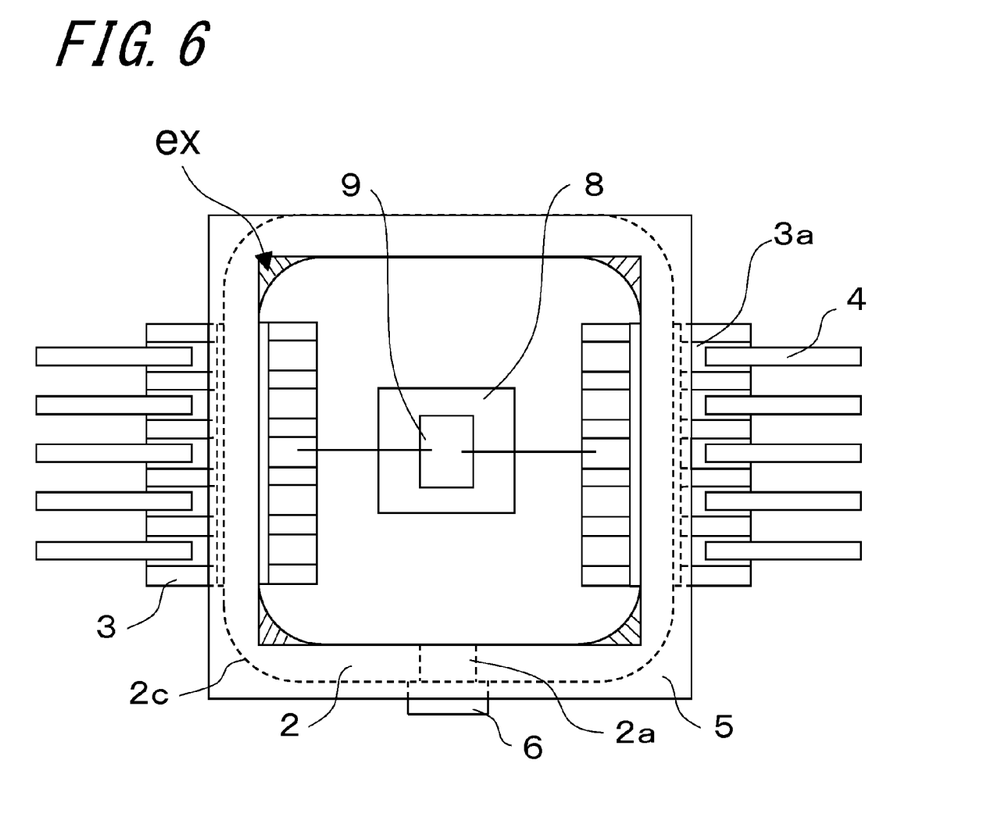
FIG. 6 is a plan view showing the electronic apparatus in accordance with one modified example of the invention, with its lid body removed.
Figure 7:
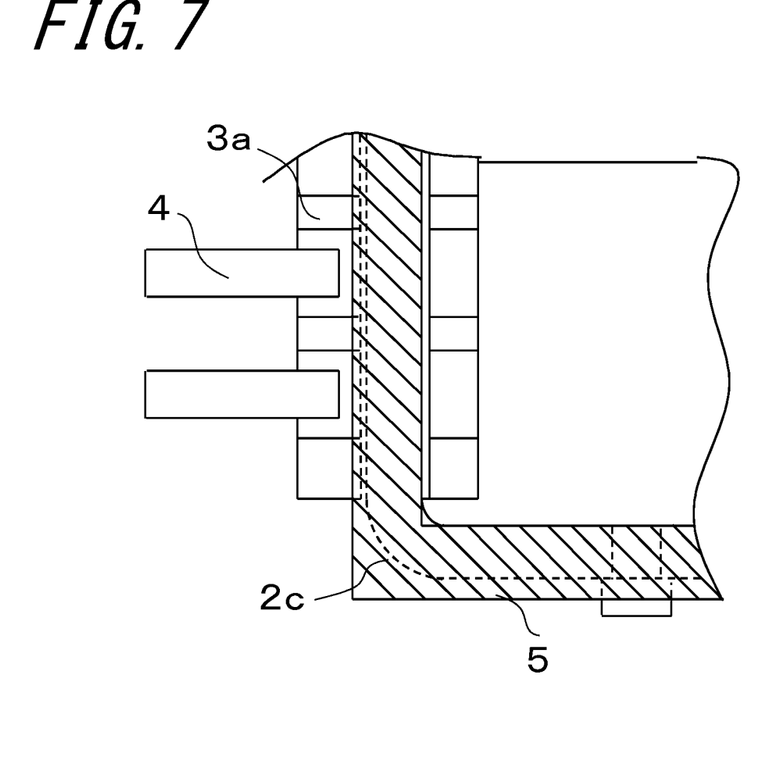
FIG. 7 is an enlarged view of a main part of the electronic apparatus as shown in FIG. 6, illustrating a positional relationship between a sealing ring and a frame body.

In the device housing package of Modified example 2 of the embodiment, as shown in FIG. 6, the sealing ring 5 may be made larger in outer shape than the frame body 2 as seen in a plan view so as to extend outward beyond the side wall provided with the through hole 2a of the frame body 2. The diagonally shaded area as seen in FIG. 6 represents the exposed part ex of the frame body 2 lying outside the sealing ring 5. Moreover, FIG. 7 is an enlarged view of a main part of the construction, illustrating the condition where the sealing ring 5, which is diagonally shaded, extends outward beyond the side wall provided with the through hole 2a of the frame body 2.

When the lid body 7 is joined to the sealing ring 5 by means of seam welding or the like, under the heat liberated by the seam welding, thermal expansion or thermal shrinkage takes place due to the difference in thermal expansion coefficient among the frame body 2, the sealing ring 5, and the lid body 7. At this time, due to the stress caused by the thermal expansion or other phenomenon, the side wall provided with the through hole 2a of the frame body 2 may undergo deformation, in consequence whereof there results misalignment of the optical axis of the optical fiber 10 disposed in the through hole 2a, which leads to the possibility of deterioration in the capability of communication of input and output of optical signals.

However, since the sealing ring 5 is disposed in abutment with the upper surface of the frame body 2 in such a way as to extend outward beyond the side wall provided with the through hole 2a of the frame body 2, it follows that the sealing ring 5 extending outward beyond the side wall provided with the through hole 2a of the frame body 2 becomes deformed. As a result, the stress caused by thermal expansion or thermal shrinkage resulting from the difference in thermal expansion coefficient between the sealing ring 5 and the lid body 7 is absorbed and lessened.

Moreover, in the seam welding, since heat is applied to the sealing ring 5 extending outward beyond the side wall provided with the through hole 2a of the frame body 2, it is possible to reduce the heat applied to the junction between the upper surface of the side wall provided with the through hole 2a of the frame body 2 and the sealing ring 5. Accordingly, the stress caused by thermal expansion or thermal shrinkage resulting from the difference of thermal expansion coefficient, expressed differently, the stress exerted on the junction between the side wall provided with the through hole 2a of the frame body 2 and the sealing ring 5. This makes it possible to render the side wall provided with the through hole 2a of the frame body 2 less prone to deformation, and thereby suppress misalignment of the optical axis of the optical fiber 10 disposed in the through hole 2a. Besides, improvement in the capability of communication of input and output of optical signals can be achieved.

Further, since the deformation of the frame body 2 can be lessened, it is possible to restrain the through hole 2a from becoming deformed, and thereby improve the mountability of the optical fiber 10 in the through hole 2a. As a result, a decrease in optical coupling efficiency can be suppressed effectively, wherefore inputting and outputting of optical signals between the electronic apparatus and the exterior thereof can be effected efficiently with stability. Note that, even with the optical fiber securing member 6 disposed on the inner side of the through hole 2a, the same effects as above described can be attained.

The invention claimed is:

1. A device housing package, comprising:
    a base body comprising, at its upper surface, a placement portion of a semiconductor device;
    a frame body disposed on the base body surrounding the placement portion, comprising a notch disposed in a side wall thereof;
    an input-output terminal attached to the notch, comprising a wiring conductor layer electrically connected to the semiconductor device; and
    a sealing ring disposed on an upper portion of the frame body, the sealing ring having a rectangular frame-like outer shape as seen in a plan view,
    the frame body including four side walls and having, when seen in a plan view, a rectangular frame-like outer shape, an outer corner of adjacent side walls of the four side walls being curved as seen in a plan view,
    an inner corner of the adjacent side walls being curved as seen in a plan view, the outer corner lying within a region overlapping the sealing ring as seen in a plan view, the inner corner being exposed in a region surrounded by the sealing ring as seen in a plan view, and
    a radius of curvature of an inner corner of the sealing ring being smaller than a radius of curvature of the inner corner of the adjacent side walls of the frame body.

2. The device housing package according to claim 1, wherein, of the side walls of the frame body, a side wall adjacent to the side wall having the notch is disposed in a manner such that an outer shape of the frame body coincides with the rectangular frame-like outer shape of the sealing ring as seen in a plan view.

3. An electronic apparatus, comprising:

the device housing package according to claim 1;

a semiconductor device disposed in the placement portion of the device housing package; and a lid body disposed on the sealing ring of the device housing package.

* * * * *